MICROWAVE ENERGY SHIELDING SYSTEM

Filed March 26, 1969

INVENTOR
ROBERT B. MARTIN

BY
Plante, Arens, Hartz, Hix and Smith
ATTORNEYS

United States Patent Office 3,608,280

Patented Sept. 28, 1971

3,608,280

MICROWAVE ENERGY SHIELDING SYSTEM

Robert B. Martin, Mishawaka, Ind., assignor to The Bendix Corporation

Filed Mar. 26, 1969, Ser. No. 810,571
Int. Cl. B01d 47/00
U.S. Cl. 55—222 7 Claims

ABSTRACT OF THE DISCLOSURE

A microwave energy shielding system for use in an opening through which fresh air is supplied to personnel and sensitive testing equipment operating within the confines of an enclosure. The shielding system passes the required air flow through an ionized solution to attenuate microwave energy in the air prior to passing through the opening in the enclosure to eliminate the effect of any outside micro frequency on the test being performed by the equipment.

BACKGROUND OF THE INVENTION

This invention relates to a microwave energy shielding system for use with an enclosure requiring a fresh supply of air for personnel working therein or electrical equipment being used therein. The invention is designed to preclude the entry of microwave energy to the interior of said enclosure. However, it is felt that the invention may be used for any application where attenuation of wave energy is required.

In numerous environments where electronic manufacturing and test equipment is being used, it is mandatory to operate same within an enclosed and shielded structure to preclude microwave energy (which is being radiated from surrounding equipment) from interfering with said electronic equipment or vice versa. The enclosure used to house the equipment is most generally of sufficient size to allow personnel to work within said enclosure to control and observe the electronic equipment. Thus, a flow of fresh air must be provided to the enclosure for the sustenance and comfort of the personnel. To provide the necessary air flow a reasonably large opening must be made in the enclosure. The opening, however, provides a path through which microwave energy may enter the enclosure and disturb the operation of the equipment. Several means have been employed to prevent the ingress of microwave energy into enclosures of the type described above.

A metallic honeycomb-like structure has been used; however, the amount of attenuation afforded by the use of this material is dependent upon cell thickness and width. Thus, to have sufficient attenuation for a sensitive electronic application, the cell dimensions are so small that an impediment to satisfactory air flow exists. Perforated metals and screen wire have also been used but have generally the same undesirable features as the metallic honeycomb.

SUMMARY OF THE INVENTION

It is an object of this invention to provide a microwave energy shielding system having a structure which will eliminate the above objections and other objections arising from the use of the techniques with which I am familiar.

It is an object of this invention to provide a microwave energy shielding system for use with an enclosure housing electronic equipment and personnel to operate same.

It is an object of this invention to provide a microwave energy shielding system having improved attenuation characteristics with respect to microwave energy while allowing a sufficient air flow to pass therethrough.

It is an object of this invention to provide means for varying the attenuation characteristics of said microwave energy shielding system.

It is an object of this invention to provide a microwave energy shielding system having greater attenuation characteristics when compared with existing devices.

It is an object of this invention to provide means to preclude leakage of microwave interference signals through an opening in an enclosure.

It is an object of this invention to provide means to condition the humidity of the air flow into enclosure.

It is an object of this invention to provide means to condition the temperature of the air flow into enclosure.

It is an object of this invention to provide a microwave energy shielding system whose manufacture, installation, and use costs are low when compared to existing techniques.

Other objects and features of the invention will be apparent from the following description of the shielding system when taken in connection with the accompanying drawings.

DESCRIPTION OF THE PREFERRED EMBODIMENT

Figures 1, 2, 3, 4:
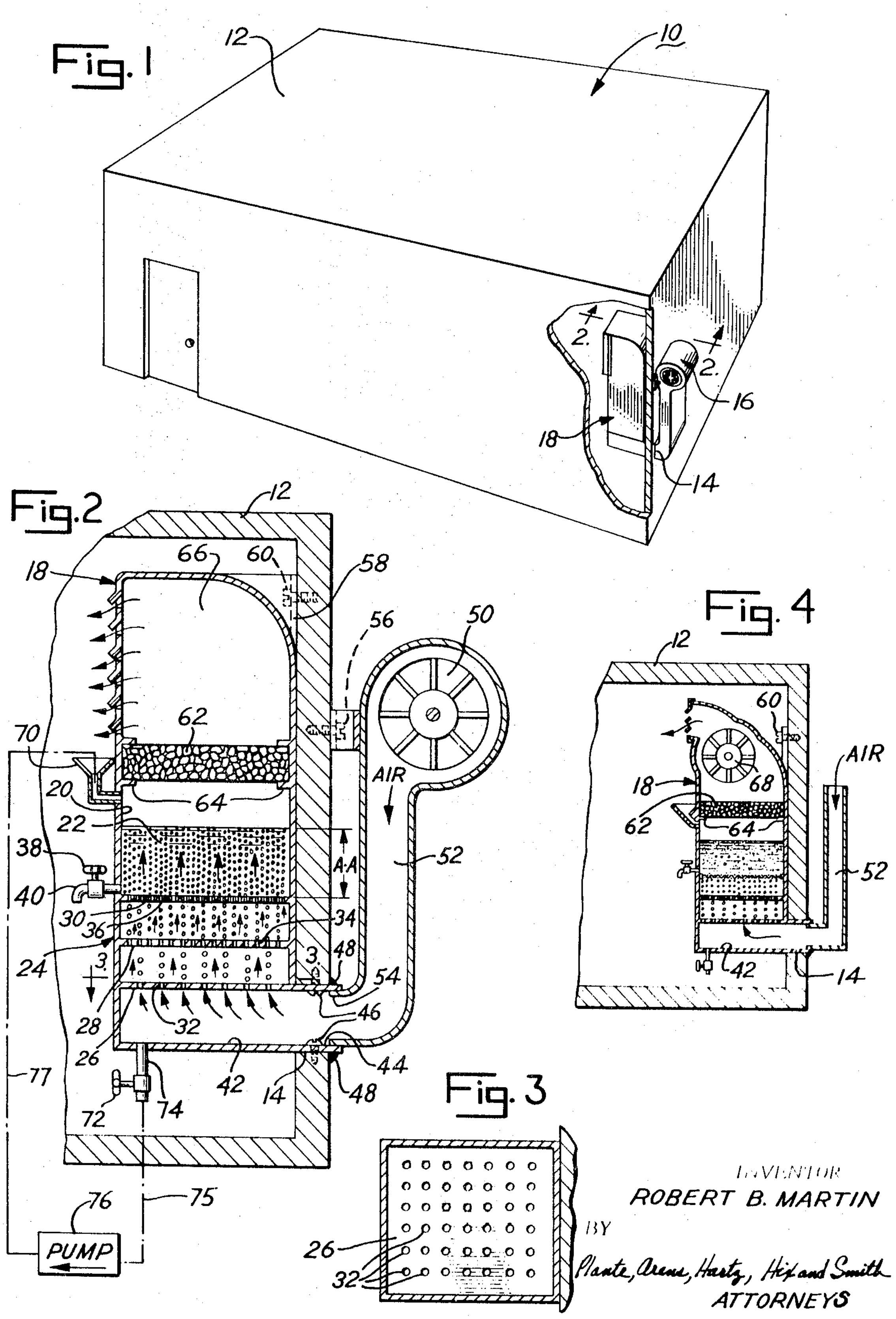
FIG. 1 is a perspective view partially fragmented, and partially sectioned, of the microwave energy shielding system.
FIG. 2 is an enlarged sectional view of the radio frequency shielding system taken along line 2—2 of FIG. 1.
FIG. 3 is a sectional view taken along line 3—3 of FIG. 2.
FIG. 4 is a sectional view, partially fragmented, of a modified form of the system shown in FIG. 2.

Referring now to the drawings and particularly to FIG. 1, the shielding system is generally designated by the numeral 10. The shielding system 10 is comprised of a room or enclosure 12 having an opening 14, a source of air flow 16 communicated to said opening 14, and a means 18 to attenuate electromagnetic radiation within said air flow. The means 18 is located in series with said opening 14 to prevent the entry of radio frequency up to and including microwave energy or interference signal into said enclosure 12 through said opening 14. The enclosure 12 is shown having the other elements functionally mounted thereto for providing the interior of said enclosure 12 a fresh air flow. Although not shown, it is understood that a second radio frequency shielding system 10 may be utilized to exhaust air from the enclosure 12 and thereby accomplish air circulation through said enclosure.

The shielding system 10 is specifically designed to substantially shield against radio frequency and electromagnetic radiation, of micro-wave lengths from sub-millimeter through those radio frequencies greater than 30,000 meters. The enclosure 12 is made of metal to insure very effective shielding properties. The enclosure 12 may be large enough to facilitate the use of reasonably large quantities of electronic test equipment or may be small so as to enclose a single piece of equipment. It is emphasized that the enclosure 12 must provide a substantially interference-free environment for the various forms of delicate testing that are to be conducted therein.

Referring now to FIG. 2, means 18 to filter attenuate electromagnetic radiation within said air flow includes a chamber 20 filled with an ionic fluid 22. Although the radio frequency attenuating fluid 22 is shown by the drawings and described in the specification as a saturated solution of sodium chloride and water, any ionized solution will afford the desired attenuation properties. Means 18 further includes a diffuser means 24 which precedes said chamber 20 to diffuse said air flow before it passes through said radio frequency attenuating fluid 22. The diffuser means 24 includes plate members 26, 28, and 30. As best seen in FIG. 3, plate member 26 has a plurality of openings 32. Plate member 28 has a larger number of openings 34 when compared to plate member 26 with each of the openings 34 being of a smaller diameter than openings 32. Plate member 30 has an even larger number of openings 36 when compared to plate member 28, with each of the openings 36 being of a diameter smaller than the openings 34 of plate member 28. It is noted that during inoperable periods, when air is not flowing as shown by the arrows, the saturated solution of sodium chloride and water 22 may be drained from chamber 20 by means of stop cock 38 and conduit 40, as will be explained in more detail hereinafter. Means 18 further includes air flow intake 42 for deflecting said air flow through said diffuser means 24. Intake 42 has a flange 44 which has the general contour of opening 14 and is secured thereto by screws 46. To prevent radio frequency penetration between flange 44 and the opening 14, a conductive means 48, comprised of silver paint or conductive epoxy, is carefully applied to the junction of said flange 44 and said opening 14 so as to seal said junction and provide an electrical and magnetic short between the periphery of the flange 44 and enclosure 12.

The source of air flow 16 is comprised of an air compressing means 50 having a conduit 52 connected to its output. The conduit 52 has on its end a flange 54 which frictionally inserts into flange 44 of said means 18. The source of air flow 16 is then secured to the outside of the enclosure 12 by bolts 56. It is noted, of course, that the air compressing means 50 acquires its input supply of fresh air from the ambient air surrounding enclosure 12.

The means 18 to filter said air flow, further includes a backing plate 58 which abuts one of the interior walls of enclosure 12. The backing plate 58, having a plurality of holes not shown, is rigidly secured to enclosure 12 by means of bolts 60.

As may be seen from the drawing, a fresh supply of air taken from the ambient surrounding enclosure 12 is pulled in by air compressor means 50 and communicated under pressure through conduit 52 and air flow intake 42 through the diffuser means 24 to permit it then to bubble up through the attenuating fluid 22, as shown best in FIG. 2 by means of the arrow flow. Additionally, the means 18 may include a dehumidifier means 62 mounted on ledges 64 to substantially remove the fluid or moisture content from said air flow after said air flow has passed through the radio frequency attenuating fluid 22.

The means 18 is further provided with an air deflecting chamber 66 to divert the air flow more uniformly into the interior of said enclosure 12. Although not shown in the drawings, chamber 66 provides sufficient space for installation of a heat transfer means for maintaining the air flow at a predetermined temperature. Obviously, said heat transfer means could include the necessary structure for either heating or cooling the air flow. It is further noted that an air suction means 68 could be suitably installed in the air deflecting chamber 66, and thus the air compressing means 50 would not be required. The air suction means 68 would, of course, pull a supply of fresh air from the ambient surrounding enclosure 12 through the conduit 52 the air flow intake 42 and up through the diffuser means 24 and attenuating fluid 22 prior to deflecting the air flow into the interior of enclosure 12, as may be best seen in FIG. 4.

As will be understood by those skilled in the art, the transmission of energy attenuating fluid 22 will also preclude radio frequency energy, emitted by electronic equipment operating within said enclosure 12, from leaking into the area surrounding said enclosure 12.

The attenuation of the energy, coming either from the outside of the enclosure 12 or from electronic equipment being used within the enclosure 12, is a function of the thickness or depth of the saturated solution of sodium chloride and water 22, and is designated by distance A—A as shown in FIG. 2. Thus, for the application which requires more attenuation, the thickness or depth of the attenuating fluid 22 may simply be increased.

MODE OF OPERATION OF THE PREFERRED EMBODIMENT

To operate the radio frequency shielding system 10, the air compressing means 50 is energized, whereby said means 50 will acquire a fresh supply of air from the ambient air surrounding enclosure 12 and provide it under pressure through conduit 52, air flow intake 42, the diffuser means 24, chamber 20, and the dehumidifier means 62, where it will be deflected by means of chamber 66 into the interior of enclosure 12. Fluid inlet 70 is attached to means 18 near the top of chamber 20 to facilitate filling said chamber 20 with the desired amount of attenuating fluid 22. The air flow provided to the diffuser means 24 is first diffused into bubble form by plate member 26 and subsequently diffused into even a smaller bubble form by plate members 28 and 30 so that said air flow as it passes through said attenuating fluid 22 is comprised of a plurality of very small bubbles. Therefore, it may be seen that over the distance identified as A—A in FIG. 2, there is no continuous air path through which energy may pass either from the interior of enclosure 12 to the exterior or vice versa. While in the bubbles, any microwave energy will be dissipated through the ionic attenuating fluid as thermal energy. The greater the number of bubbles the more effective the attenuation of the microwave energy. As the air flow passes through the attenuating fluid 22 any excess moisture acquired from the fluid is removed by the dehumidifier means 62. As previously mentioned the air flow may be further heated or cooled prior to being deflected by chamber 66 into the interior of enclosure 12.

It is additionally noted that the attenuating fluid 22 will become somewhat contaminated or dirty from dirt particles carried with a slight temperature change by the flow of air through the fluid 22. A portion of the dirt particles are removed by a conventional air flow filter installed on the input of said air compressing means 50. The temperature change due to the change from microwave energy to thermal energy is so slight that no harmful effect occurs since it is compensated for by cooling caused by evaporation of the attenuation fluid.

To de-energize the shielding system 10, stop cock 38 is opened so as to drain the attenuating fluid 22 through conduit 40. The air compressing means 50 may then be de-energized.

It is noted that in the absence of air flow the attenuating fluid 22 will drain, due to the force of gravity through the diffuser means 24 and into the air flow intake 42. It may therefore, be desirable to provide a stop cock 72 and conduit 74 to drain any excess attenuating fluid 22 that may accumulate in air flow intake 42. It is further noted that wetting action between the attenuating fluid 22 and the openings of the diffuser means 24 may cause said fluid to trickle into air flow intake 42 during operation of said shielding system 10. Therefore, a recirculation system may be provided to keep the appropriate amount of radio frequency attenuating fluid 22 in said chamber 20. Said recirculation system may be comprised of a conduit 75 connected to conduit 74, a pump 76 in series flow with said conduit 75, and a conduit 77 to communciate the output of the pump to the fluid inlet 70.

Obviously, many modifications and variations of the present invention are possible in the light of the above teachings. Thus, it is intended to cover all changes and modifications of the embodiment set forth therein which do not constitute departures from the spirit and scope of the invention.

What is claimed is:

1. A microwave energy shielding system, comprising: an enclosure which prevents the transmission of electromagnetic radiation therethrough having an opening;

a housing having a chamber therein with an inlet port and an outlet port, said housing being connected to said opening and said enclosure;

means for communicating a supply of air through said opening for ventilating said enclosure, said supply of air passing through said inlet and outlet ports and said chamber;

an ionic solution located in said chamber;

means for attenuating electromagnetic radiation of microwave length present in said air by bubbling said air through a continuous liquid phase of said ionic solution which dissipates said electromagnetic radiation as thermal energy and thereby prevents transmission of said electromagnetic radiation to and from said enclosure; and diffuser means for creating a stream of said air bubbles from said airflow through said ionic solution, said bubbles being of a size and quantity to effectively attenuate said electromagnetic radiation.

2. The microwave energy shielding system as recited in claim 1 wherein the ionic solution between said bubbles will provide a barrier which absorbs said electromagnetic radiation.

3. The microwave energy shielding system, as recited in claim 1 including:

means surrounding said opening for preventing electromagnetic radiation from passing between said enclosure and said housing.

4. The microwave energy shielding system as recited in claim 3 wherein said diffuser means includes:

a plurality of plates located in said chamber to break up the flow of said air to prevent the direct transmission of a bubble through the ionic solution.

5. The microwave energy shielding system as recited in claim 4 including:

dehumidifier means located in said housing between said ionic solution and said enclosure for maintaining the relative humidity of said air at a predetermined value.

6. The microwave energy shielding system as recited in claim 5 including:

heat transfer means located in said housing between said dehumidifying means for maintaining the temperature of said air at a predetermined value.

7. The microwave energy shielding system as recited in claim 6 wherein said means for communicating air to said enclosure includes:

fan means located in said housing and operatively connected to said chamber for moving said air through said ionic solution at a uniform velocity.

References Cited

UNITED STATES PATENTS

| | | | |
|---|---|---|---|
| 1,409,364 | 3/1922 | Dobbs et al. | 55—279X |
| 1,518,162 | 12/1924 | Parkinson | 55—259X |
| 1,861,158 | 5/1932 | Hilger | 261—11 |
| 2,234,385 | 3/1941 | Ryner | 261—113 |
| 2,342,689 | 2/1944 | Pennington | 62—129 |
| 2,703,228 | 3/1955 | Fleisher | 55—222 |
| 3,261,147 | 7/1966 | Allander | 55—279X |
| 3,370,404 | 2/1968 | Leeper | 55—233 |
| 3,429,676 | 2/1969 | Gatza | 261—123X |
| 1,223,515 | 4/1917 | Papanastasiou | 98—30 |
| 1,982,305 | 11/1934 | Hunicke | 261—H.R.UX |
| 2,221,944 | 11/1940 | Goddard | 174—35(MS)X |
| 2,293,839 | 8/1942 | Linder | 174—35(MS)X |
| 2,870,439 | 1/1959 | Stinehelfer | 174—35(MS)UX |
| 3,115,450 | 12/1963 | Schanz | 250—108X |
| 3,145,640 | 8/1964 | Jaha | 98—1(ARS)X |
| 3,207,671 | 9/1965 | Kornbichler | 176—38 |
| 3,265,898 | 8/1966 | Lehmer | 250—108(WS) |
| 3,315,732 | 4/1967 | Garwin et al. | 250—108(R)X |
| 3,482,377 | 12/1967 | Walrave | 55—385X |

FOREIGN PATENTS

| | | | |
|---|---|---|---|
| 515,502 | 11/1920 | France | 261H.R. |
| 539,966 | 3/1956 | Germany | 174—35(MS) |

DENNIS E. TALBERT, Jr., Primary Examiner

U.S. Cl. X.R.

55—226, 229, 255, 256, 259, 260, 267, 316, 318, 360, 385, 473, 512; 98—1, 30; 174—16, 35 MS; 250—108 R; 261—3, 113, 123